United States Patent [19]

Houchin et al.

[11] Patent Number: 5,202,095

[45] Date of Patent: Apr. 13, 1993

[54] MICROWAVE PLASMA PROCESSOR

[75] Inventors: Ryuzoh Houchin; Naoki Suzuki, both of Osaka, Japan

[73] Assignee: Matsushita Electric Industrial Co., Ltd., Osaka, Japan

[21] Appl. No.: 861,179

[22] Filed: Mar. 27, 1992

Related U.S. Application Data

[63] Continuation of Ser. No. 457,425, Dec. 27, 1989, abandoned.

[30] Foreign Application Priority Data

Dec. 27, 1988 [JP] Japan .................. 63-332908

[51] Int. Cl.⁵ .................................................. B01J 19/08
[52] U.S. Cl. ........................... 422/186; 204/298.38; 204/157.43; 156/643; 219/121.4
[58] Field of Search ............... 422/186; 204/298.38, 204/192.37, 192.34, 157.43; 156/643, 662; 219/121.4

[56] References Cited

U.S. PATENT DOCUMENTS

| | | | |
|---|---|---|---|
| 4,006,338 | 2/1977 | Dehn | 219/10.55 F |
| 4,169,267 | 9/1974 | Wong et al. | 343/895 |
| 4,581,100 | 4/1986 | Hatzakis et al. | 204/298.38 |
| 4,745,337 | 5/1988 | Pichot et al. | 219/121.4 |

FOREIGN PATENT DOCUMENTS 53-44795 12/1978 Japan .

Primary Examiner—J. Woodrow Eldred
Attorney, Agent, or Firm—Panitch Schwarze Jacobs & Nadel

[57] ABSTRACT

A microwave plasma processor comprising a vacuum chamber with a gas introduction inlet, an exhaust port, a sample table for loading thereon a sample, a plurality of microwave radiation antennas, and a corresponding plurality of microwave energy introduction inlets thereby enabling a large area substrate to be uniformly plasma-processed at high speed.

7 Claims, 2 Drawing Sheets

MICROWAVE PLASMA PROCESSOR

This is a continuation of application Ser. No. 07/457,425, filed Dec. 27, 1989, now abandoned.

BACKGROUND OF THE INVENTION

1. Field of the Invention

The present invention relates to a plasma processor used in a process of manufacturing semiconductors, thin film devices, and the like.

2. Description of the Prior Art

In a process of manufacturing semiconductors, thin film devices, and the like, an etching apparatus or a resist asher using microwave energy is used.

FIG. 5 shows a conventional resist asher, in which a vacuum chamber 1 has a gas introduction inlet 2 and an exhaust port 3 and is partitioned by a quartz plate 4 sealed at the edge with an O-ring. The inside of the vacuum chamber 1 is kept under reduced pressure and is provided with a table 7 for loading thereon a sample 8. At the upper portion of vacuum chamber 1 is provided a chamber 6 for trapping therein microwaves. A single waveguide 5 for transporting the microwaves from a microwave generating source (not shown) into the chamber 6 is connected with the upper portion of chamber 6.

A resist is etched as follows: First, of all, oxygen is pumped into the vacuum chamber 1 at a flow rate of 50 standard cubic centimeters per minute (SCCM) through the gas introduction inlet 2 so as to keep the pressure in the vacuum chamber 1 at 0.5 Torr. Microwave energy is applied from the microwave generating source (not shown) into the chamber 6 through the waveguide 5 with a power of 400 W to generate plasma for etching the resist. The etching speed for the resist is 3000 Å/min at 20° C. and 8000 Å/min at 200° C. depending upon the temperature of the sample table 7. The uniformity of etching is found to be accurate within ±15% per 6 inch wafer.

Such an apparatus with the above-mentioned construction has a problem in that it is difficult to etch uniformly and at a high speed with a substrate having a diameter of 8 inches or more, because the chamber must be of resonance construction in order to efficiently introduce the microwave energy thereinto, which causes difficulties in freely designing the construction of the apparatus.

SUMMARY OF THE INVENTION

The microwave plasma processor of this invention, which overcomes the above-discussed and numerous other disadvantages and deficiencies of the prior art, comprises a vacuum chamber with a gas introduction inlet, an exhaust port, a sample table for loading thereon a sample, and a plurality of microwave radiation antennas.

In a preferred embodiment, each of said microwave radiation antennas is composed of a helical coil.

In a preferred embodiment, a portion of said vacuum chamber is composed of a dielectric material and said microwave radiation antennas are provided at the outer periphery of said dielectric material.

In a preferred embodiment, the vacuum chamber has a magnetic field generating means at the outer periphery of each of said microwave radiation antennas.

In a preferred embodiment, waveguides are employed for introducing the microwave energy therethrough into said vacuum chamber.

In a preferred embodiment, coaxial cables are employed for introducing the microwave energy therethrough into said vacuum chamber.

Thus, the invention described herein makes possible the objectives of (1) providing a microwave plasma processor with a plurality of microwave radiation antennas and which introduces microwave energy into a vacuum chamber through a plurality of waveguides, thereby enabling a large area substrate to be uniformly plasma-processed at high speed, the use of the waveguides making output of microwave energy larger than the use of coaxial cables, and (2) providing a microwave plasma processor with a plurality of microwave radiation antennas and which introduces microwave energy into a vacuum chamber through a plurality of coaxial cables, thereby enabling a large area substrate to be uniformly plasma-processed at high speed, the use of coaxial cables being more advantageous over the use of waveguides in that the processor can be miniaturized.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
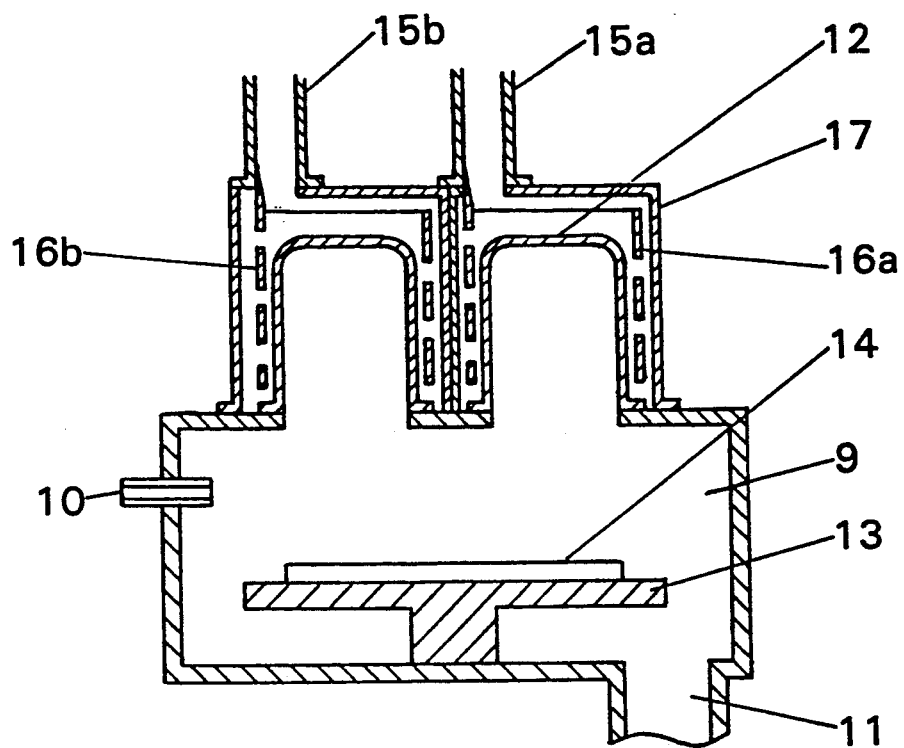
FIG. 1 is a schematic sectional view showing a microwave plasma processor of this invention.

FIG. 1 shows a microwave plasma processor of the invention, which comprises a vacuum chamber 9 with a gas introduction inlet 10 and an exhaust port 11. The vacuum chamber 9 is partitioned by a dielectric material such as quartz bell-jars 12 sealed at the edge with an O-ring. The inside of the vacuum chamber 9 is kept under reduced pressure. In the vacuum chamber 9, a sample table 13 for loading a sample 14 to be etched is disposed. Above the vacuum chamber 9, spaces are formed which are closed by shields 17 that prevent microwaves from escaping outside. The spaces are connected to waveguides 15a and 15b for introducing therethrough the microwave energy from a microwave generating source (not shown) into the spaces respectively. Microwave radiation antennas 16a and 16b for radiating the microwave energy are disposed within the spaces, respectively, at the outer periphery of the dielectric material of the vacuum chamber 9.

Figure 2:
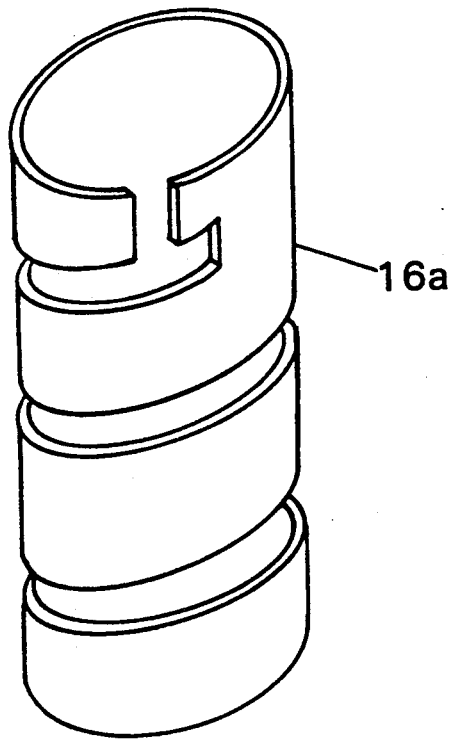
FIG. 2 is a perspective view showing a microwave radiation antenna used in the plasma processor of FIG. 1.

FIG. 2 is a perspective view of the microwave radiation antenna 16a, which is composed of a helical coil. Each antenna has an inner diameter of 60 mm, an outer diameter of 72 mm, a length of 170 mm, a slit width of 10 mm, a slit pitch of 30 mm, and an entire slit length of 1040 mm (an integral multiple of half of microwave wavelengths). The vacuum chamber can be provided with a magnetic field generating means at the outer periphery of each of the microwave radiation antennas so as to effectively generate plasma within the vacuum chamber 9.

Figure 3:
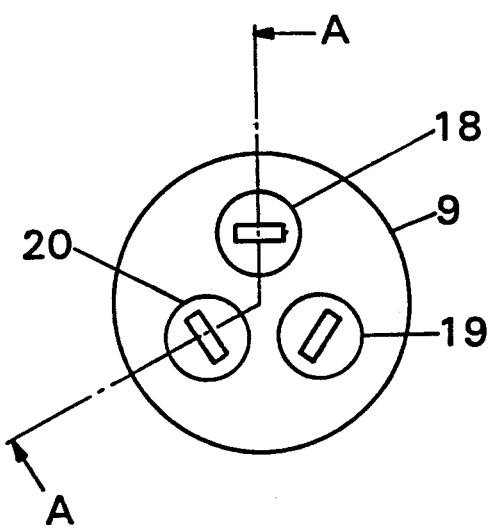
FIG. 3 is a schematic plan view showing the microwave plasma processor of FIG. 1.

As shown in FIG. 3, microwave antennas 18, 19 and 20 are disposed apart from each other at equal intervals in the vacuum chamber 9 and have the same construction, respectively. Incidentally, FIG. 1 is a sectional view taken on the line A—A in FIG. 3.

The microwave plasma processor constructed as mentioned above is used to etch a resist. As a sample, a 8 inch silicon substrate coated with resist of 1 μm in thickness was used. Oxygen was charged from the gas introduction inlet 10 into the vacuum chamber 9 at a flow rate of 50 SCCM and the inside of the vacuum chamber 9 was kept under a pressure of 0.5 Torr. Microwave energy was applied at every 300 W to each antenna so as to etch the resist. The etching speed for the resist was 5000 Å/min when the temperature of the sample table was 20° C. and 12,000 Å/min when the temperature of the sample table was 200° C. The uniformity of etching was found to be accurate within ±15%.

As seen from the above, the present embodiment uses three microwave radiation antennas, which enables the substrate with a large area to be uniformly etched at high speed.

Example 2

Figure 4:
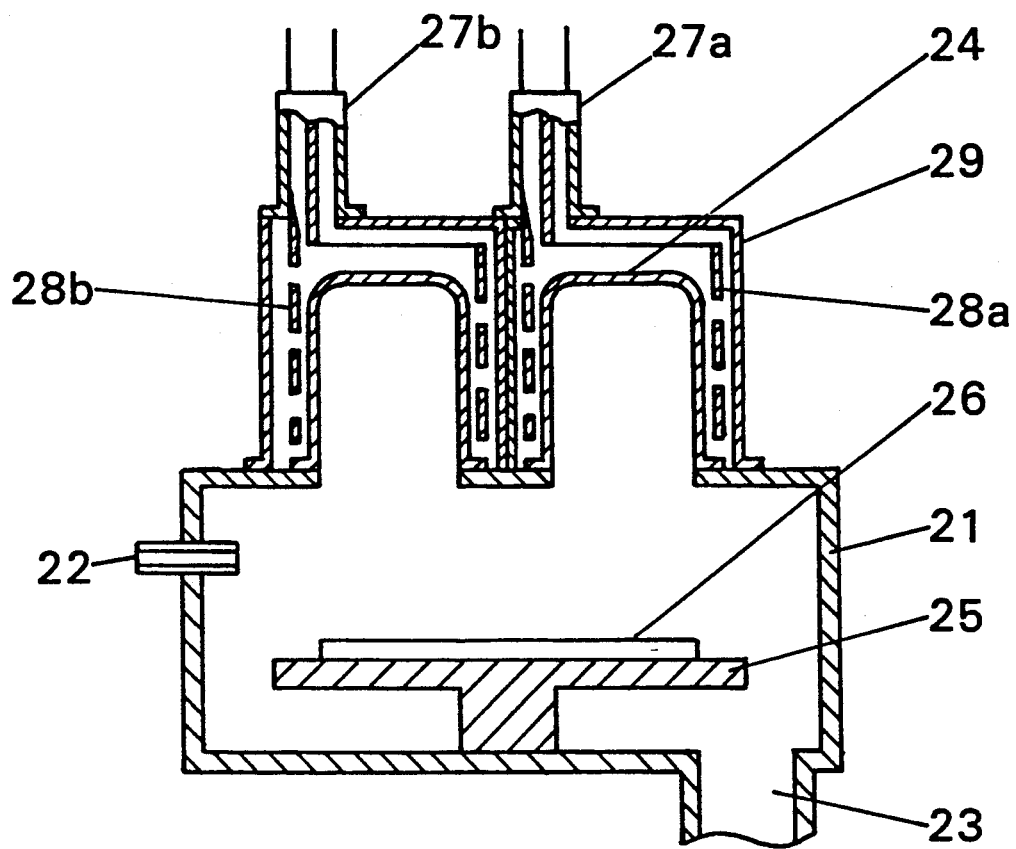
FIG. 4 is a schematic sectional view showing another microwave plasma processor of this invention.
Figure 5:
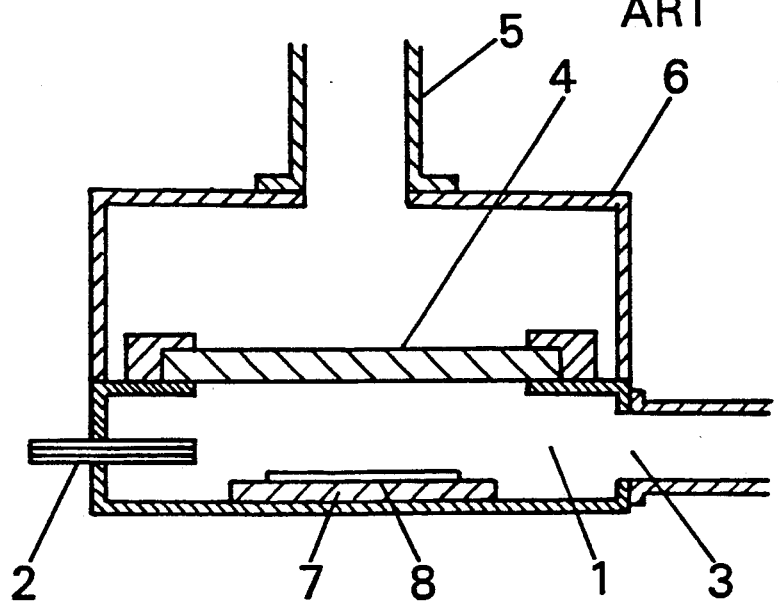
FIG. 5 is a schematic sectional view showing a conventional (prior art) microwave plasma processor.

FIG. 4 shows another microwave plasma processor of this invention. As shown in FIG. 4, a vacuum chamber 21 has a gas introduction inlet 22 and an exhaust port 23 and is partitioned with bell-jars 24 sealed by an O-ring. The inside of the vacuum chamber 21 is kept under reduced pressure. In the vacuum chamber 21 is disposed a sample table 25 for loading thereon a sample 26 to be etched. Above the vacuum chamber 21, spaces are formed, each of which is closed by a shield 29 that prevents the microwave from leaking outside. The spaces are connected to coaxial cables 27a and 27b for introducing therethrough the microwave from a microwave energy generating source (not shown) into the processor. Microwave radiating antennas 28a and 27b for radiating the microwave energy are disposed within the spaces, respectively. The microwave energy is introduced from one microwave generating source such as a microwave oscillator to the respective microwave antennas into the corresponding coaxial cable through a distributor. The construction of this example is the same as that of Example 1 except for introducing the microwave energy into the processor via the coaxial cables.

The microwave radiation antennas of this example are the same as those of Example 1 and three microwave radiation antennas are provided in the same way as that of Example 1.

Oxygen is charged at a flow rate of 50 SCCM from the gas introductio.: inlet 22 into the vacuum chamber 21, the inside of which is kept under a pressure of 0.5 Torr. The microwave energy is applied at 200 W to each radiation antenna. The etching speed for the resist is 3000 Å/min when the temperature of the sample table is 20° C. and 8000 Å/min when the temperature of the sample table is 200° C., and the uniformity of etching is found to be accurate within ±10%.

As mentioned above, according to this example, a substrate with a large area can be uniformly processed at high speed. Example 2 is advantageous over Example 1 in that the coaxial cables are used to miniaturize the apparatus, but, is also disadvantageous in that the output of microwave energy is limited to a certain extent.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A microwave plasma processor comprising:
   a chamber, including a first chamber for a sample, and a plurality of second chambers for generating plasma;
   a plurality of microwave radiation antennas outside said second chambers; and
   a plurality of microwave introduction inlets from which microwave energy is introduced into said chamber through said microwave radiation antennas,
   said first chamber including a gas introduction inlet, an exhaust port, and a sample table for loading thereon a sample, and said second chambers composed of a dielectric material;
   and wherein said plurality of microwave energy introduction inlets corresponds in number to said microwave radiation antennas.

2. A microwave plasma processor according to claim 1, wherein each of said microwave radiation antennas is composed of a helical coil.

3. A microwave plasma processor according to claim 1, wherein each of said microwave radiation antennas is composed of a uniform diameter helical coil.

4. A microwave plasma processor according to claim 1, wherein the microwave introduction inlets are waveguides for introducing the microwave energy therethrough into said chamber.

5. A microwave plasma processor according to claim 1, wherein the microwave introduction inlets are coaxial cables for introducing the microwave energy therethrough into said chamber.

6. A microwave plasma processor, comprising:
   a chamber in which plasma is formed, said chamber comprising a main chamber and a plurality of subchambers which protrude from the main chamber; and
   antenna means for introducing electromagnetic energy into said chamber, said antenna means comprising a number of antennas corresponding to the plurality of subchambers, each antenna being located outside of said chamber and adjacent to one of said subchambers.

7. A microwave plasma processor, comprising:
   a chamber in which plasma is formed, said chamber comprising a main portion and a plurality of subchambers which protrude from the main chamber, each of the subchambers being equally spaced about the main chamber; and
   antenna means for introducing electromagnetic energy into said chamber, said antenna means comprising a number of antenna corresponding to the plurality of subchambers, each antenna being located outside of said chamber and adjacent to one of said subchambers.

* * * * *

UNITED STATES PATENT AND TRADEMARK OFFICE
CERTIFICATE OF CORRECTION

PATENT NO. : 5,202,095
DATED : April 13, 1993
INVENTOR(S) : Ryuzoh Houchin et al.

It is certified that error appears in the above-identified patent and that said Letters Patent is hereby corrected as shown below:

In column 1, line 29, delete "," after "First".

In column 3, line 43, "27b" should read --28b--.

Signed and Sealed this

Eighth Day of February, 1994

Attest:

BRUCE LEHMAN

*Attesting Officer*  *Commissioner of Patents and Trademarks*